United States Patent [19]
Hamilton, Jr.

[11] Patent Number: 5,723,866
[45] Date of Patent: Mar. 3, 1998

[54] METHOD FOR YIELD AND PERFORMANCE IMPROVEMENT OF LARGE AREA RADIATION DETECTORS AND DETECTORS FABRICATED IN ACCORDANCE WITH THE METHOD

[75] Inventor: William J. Hamilton, Jr., Ventura, Calif.

[73] Assignee: HE Holdings, Inc., Los Angeles, Calif.

[21] Appl. No.: 670,478

[22] Filed: Jun. 26, 1996

[51] Int. Cl.⁶ .......................... H01L 27/144; H01L 31/09
[52] U.S. Cl. .................. 250/370.09; 250/370.01
[58] Field of Search ...................... 250/370.09, 370.1, 250/370.08, 370.01

[56] References Cited

U.S. PATENT DOCUMENTS

| | | | |
|---|---|---|---|
| 5,107,122 | 4/1992 | Barkan et al. | 250/370.01 |
| 5,379,336 | 1/1995 | Kramer et al. | 378/98.8 |
| 5,391,882 | 2/1995 | Rhiger | 250/370.13 |
| 5,518,956 | 5/1996 | Liu et al. | 437/173 |

FOREIGN PATENT DOCUMENTS 52-74290  6/1977  Japan ................ 250/370.01

OTHER PUBLICATIONS

Koh-ichi Mochiki, Ken-ichi Hasegawa, and Shuji Namatame, "Amorphous Silicon Position-Sensitive Detector." *Nuclear Instruments and Methods in Physics Research* A273 (1988) pp. 640-644.

"Very High Resolution Detection of Gamma Radiation at Room-Temperature using P-I-N Detectors of CdZnTe and HgCdTe", W.J. Hamilton, et al., IEEE Transactions on Nuclear Science, vol. 41, No. 4, Aug. 1994 pp. 989-992.

"Single-polarity charge sensing in ionization detectors using coplanar electrodes", P.N. Luke, Appl. Phys. Lett. 65 (22), Nov. 28, 1994 pp. 2884-2886.

"Radiation Detection and Measurement", Glenn F. Knoll, John Wiley & Sons, 1989 pp. 149-157.

*Primary Examiner*—Constantine Hannaher
*Attorney, Agent, or Firm*—W. C. Schubert; W. K. Denson-Low

[57] ABSTRACT

A large area radiation detector (1) includes a volume of semiconductor material (24) that is responsive to ionizing radiation for generating charge carriers, a first electrode (26) coupled to one surface of the volume of semiconductor material, and a plurality of second electrodes (20, 22) coupled to a second surface of the volume of semiconductor material. Individual ones of the second electrodes are associated with an underlying region of the volume of semiconductor material for collecting charge carriers from the underlying region. The detector further includes circuitry (30, 31, 32) coupled to the plurality of second electrodes for summing charge carriers collected by the plurality of second electrodes to produce an output signal, and a mechanism for selectively decoupling individual ones of the second electrodes from the circuitry. In one embodiment the circuitry includes electrically conductive traces (16) that couple individual ones of the second electrodes to a summing junction (31), and the mechanism for selectively decoupling includes physically opening a trace to disconnect the second electrode from the summing junction. In a further embodiment the mechanism for selectively decoupling includes a semiconductor switch (34) that is coupled in series with each of the traces.

20 Claims, 3 Drawing Sheets

METHOD FOR YIELD AND PERFORMANCE IMPROVEMENT OF LARGE AREA RADIATION DETECTORS AND DETECTORS FABRICATED IN ACCORDANCE WITH THE METHOD

FIELD OF THE INVENTION:

This invention relates generally to fabrication techniques for radiation detectors and, in particular, to fabrication techniques for large area detectors of ionizing radiation.

BACKGROUND OF THE INVENTION:

Most conventional techniques for detecting ionizing radiation (gamma rays, x-rays, and other energetic particles) with solid-state semiconductor devices rely on two-terminal devices. Reference in this regard may be had to commonly assigned U.S. Pat. No. 5,391,882, entitled "Semiconductor Gamma Ray Detector Including Compositionally Graded, Leakage Current Blocking Potential Barrier Layers and Methods of Fabricating the Detector", by David R. Rhiger.

In a solid-state detector the ionizing radiation produces electron-hole pairs within the semiconductor material, which then move under the influence of an applied electric field toward their respective contact terminals (electrons towards a positive terminal and holes towards a negative terminal).

A problem arises in conventional large area, solid state detectors, in that a single short-circuit may impair the detector from performing to minimum dark current and signal to noise requirements. A localized area of poor resistivity can degrade the performance of the entire detector because of the potentially large contribution to the total leakage current by the localized area of poor resistivity.

Such large-area, single-element radiation detectors can be employed for the efficient detection of high energy gamma rays and other types of ionizing radiation. A large area is required in order to increase the detection efficiency to very low concentrations of radioactive trace elements to allow a rapid detection of the presence of, and possibly also the identification of, the type of isotope. A reduction in detection time, or alternatively an enhanced sensitivity in a predetermined time, is thus an important goal.

Such large area, solid-state detectors are in the process of replacing conventional scintillator/photomultipliers, for example, for the field identification of nuclear isotopes. One present limitation to the more wide-spread use of solid-state detectors is the relatively small size of the detectors that are currently producible. An ability to increase the size of solid-state detectors, within the capabilities of current materials technology, is thus a further important goal.

One of the major difficulties in the production of solid-state radiation detectors is the requirement that the area of the detector be large, so as to present the largest cross-section to the source of radiation to detect the maximum number of available photons or ionizing particles. The above mentioned problem regarding localized areas of low or zero resistance arises because of the difficulty of producing large area, solid-state detector crystals with very high uniformity in physical, mechanical, chemical stoichiometry, chemical impurities, and micro-defects such as dislocations, twins, grain boundaries, precipitates, etc. These inhomogeneities result in localized electric field distortions, short circuits that permit high leakage current flow, and high levels of trapping sites localized within small regions of the detector volume.

In that the entire volume of the detector represents a single current circuit, the performance of the detector may be far less than is indicated by tests of only small areas of the detector. In a limiting case, a short circuit at any location in the detector may short circuit, and thus render useless, the entire detector.

OBJECTS OF THE INVENTION:

It is a first object of this invention to provide an improved large area, solid state radiation detector that overcomes the foregoing and other problems.

It is a second object of this invention to provide an improved large area, solid state radiation detector that is pixellated or partitioned into discrete detecting regions, wherein a small region or regions of the detector having a defect can be physically or electrically removed during initial testing or during field use of the detector.

It is a still further object of this invention to provide a method for operating an improved large area, solid state radiation detector.

SUMMARY OF THE INVENTION

The foregoing and other problems are overcome and the objects of the invention are realized by methods and apparatus in accordance with embodiments of this invention. In accordance with an aspect of this invention the pixellation of the surface of single element, large-area radiation detector is employed to significantly improve performance and yield. By summing the output signals from all pixels in parallel, while eliminating individual defective or poor-performing pixels from the signal summation, the signal to noise ratio of the large area detector is significantly improved. By isolating a defective region associated with a single or limited number of pixels, and then eliminating this pixel or pixels from the signal summation, the remainder of the large area detector may be entirely and effectively used for high quality detection.

It should be noted that the purpose of the large area of the detector is to collect a large solid-angle of radiation to generate a large signal, and not to form an image. Thus, reference to the detector being comprised of pixels is not intended to indicate that the pixels are used to form an image of a scene, as is the case with conventional arrays of radiation detectors, such as staring-type focal plane arrays (FPAs).

Since uniformity in a large area structure formed from elemental and compound semiconductors is difficult to achieve in practice, the pixellation of the structure enables the isolation of small regions of the detecting volume. This in turn enables the elimination of shorts, low-resistivity regions, and areas of degraded performance, such as areas that experience low-resolution due to trapping phenomena within the semiconductor material of the detecting volume. This beneficially results in a significantly higher yield, with concomitant lower cost, and a resulting significant improvement in the performance of large area detectors.

This invention thus teaches a large area radiation detector that includes a volume of semiconductor material that is responsive to ionizing radiation for generating charge carriers, a first electrode coupled to one surface of the volume of semiconductor material, and a plurality of second electrodes coupled to a second surface of the volume of semiconductor material. Individual ones of the second electrodes are associated with an underlying region of the volume of semiconductor material for collecting charge carriers from the underlying region. The detector further includes circuitry coupled to the plurality of second electrodes for summing charge carriers collected by the plurality of second electrodes to produce an output signal, and a mechanism for selectively decoupling individual ones of the second electrodes from the circuitry.

In one embodiment of the invention the circuitry includes electrically conductive traces that couple individual ones of the second electrodes to a summing junction, and the mechanism for selectively decoupling includes physically opening a trace to disconnect the second electrode from the summing junction. In a further embodiment of the invention the mechanism for selectively decoupling includes a semiconductor switch that is coupled in series with each of the traces.

The detector may be a monolithic assembly, or may be a hybridized assembly wherein a radiation detector chip or structure is electrically and physically connected with a readout integrated circuit or structure. Indium bumps can be used to hybridize the two structures.

BRIEF DESCRIPTION OF THE DRAWINGS

The above set forth and other features of the invention are made more apparent in the ensuing Detailed Description of the invention when read in conjunction with the attached Drawing wherein.

DETAILED DESCRIPTION OF THE INVENTION

Figure 1:
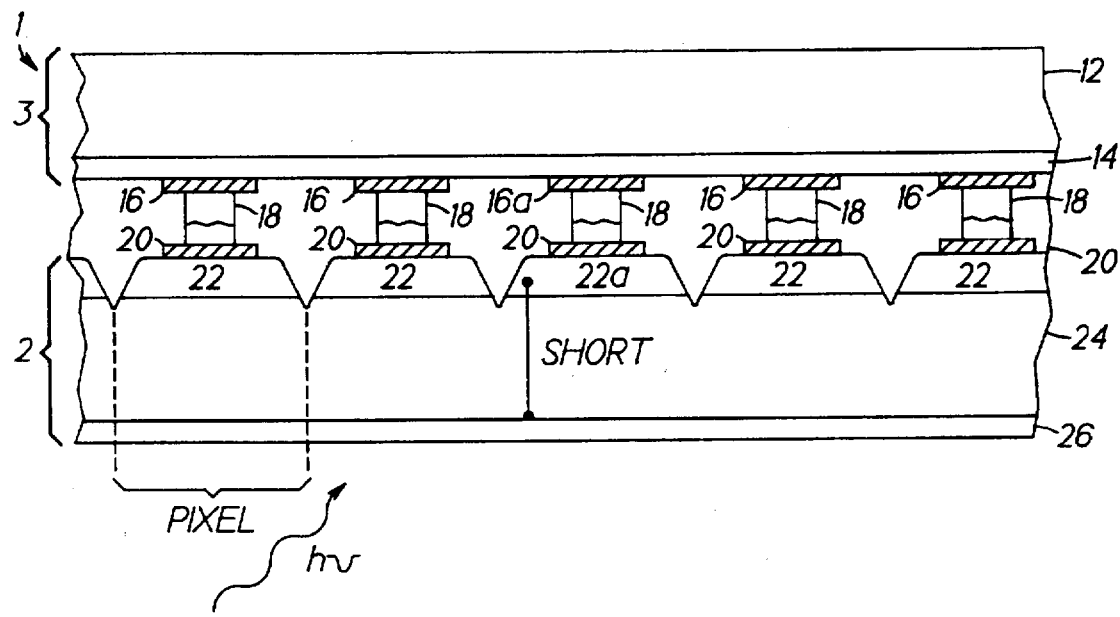
FIG. 1 is an enlarged cross-sectional view (not to scale) of a large area pixellated radiation detector in accordance with this invention.

Referring to FIG. 1, a large area, solid state radiation detector 1 is comprised of a pixellated radiation-responsive semiconductor structure 2 which is hybridized with a readout integrated circuit (ROIC) 3. The ROIC 3 is comprised of a semiconductor (e.g., silicon) substrate 12, an insulating layer 14, and a plurality of electrically conductive, typically metal or polysilicon, traces 16. The semiconductor structure 2, wherein the detection of ionizing radiation takes place, is comprised of barrier metal 20, electrically conductive semiconductor (e.g., p-type HgCdTe) islands or mesa-type structures 22 (nominal thickness of about 15 micrometers), a wide bandgap detection layer 24 comprised of, by example, CdTe or CdZnTe, having a thickness of, by example, 0.1 cm, and a contact layer 26, such as a layer of n-type semiconductor material. The mesas 22 and the contact layer 26 could each be comprised instead of a layer of an electrically conductive metal, or a combination of HgCdTe and an electrically conductive metal. In the illustrated device the contact layer 26 forms a common electrode, and individual ones of the mesas 22 and barrier metal 20 form separate electrodes and define individual ones of the pixels. In a conventional large area, solid state radiation detector both major surfaces of the detection layer 24 would be covered by a single large area electrode. The incident ionizing radiation (hv) can be, by example, electromagnetic radiation such as x-rays and gamma rays (or any electromagnetic radiation having a wavelength less than the pixel size), or a particle flux comprised of charged particles, such as protons or charged sub-atomic particles, or atomic nuclei or fragments thereof, such as cosmic rays and fission products, or neutral particles, such as neutrons or neutral sub-atomic particles.

As is indicated in FIG. 1, it is preferred that each pixel be electrically isolated from every other pixel. This can be accomplished by forming the mesas 22 such that the side walls terminate (as shown) within the wide bandgap detection layer 24. If a layer of metal is patterned to form the individual pixel contacts, then the metal should be completely removed between pixels.

The ROIC 3 and the structure 2 are electrically and physically coupled together through respective electrically conductive bumps, such as solder bumps or indium bumps 16 and 18, which are cold-welded in a known fashion.

The formation of the individual pixels may be accomplished by photolithography and etching of the contact layer on the surface of the layer 24, thereby forming the plurality of discrete mesa structures 22. One suitable method for connecting the pixel elements of the structure 2 to the ROIC 3 is described in U.S. Pat. No. 5,379,336 to Kramer et al.

The individual mesas 22 thus replace the conventional blanket electrode that would conventionally be applied to this surface of the semiconductor layer 24, thereby pixellating or partitioning the semiconductor layer into a plurality of smaller discrete areas or pixels. This beneficially enables a region of degraded semiconductor material within the detecting layer 24, illustrated schematically by a short circuit associated with the mesa 22a and ROIC metal 16a, to be physically or electrically isolated.

Figure 2:
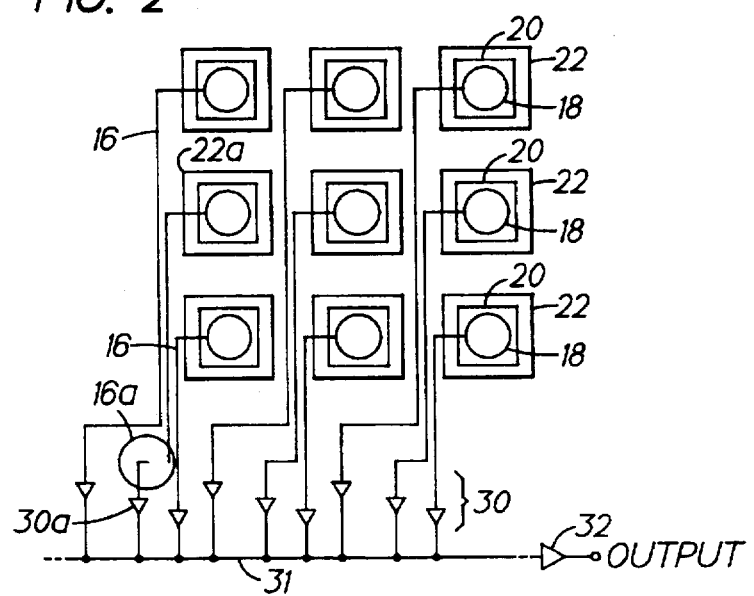
FIGS. 2 and 3 are each a top view of the detector of FIG. 1, and illustrate a location where a pixel associated with an area of marginal performance of the detector is physically removed prior to a pixel summing junction.

Further in this regard, reference is made to the view of FIG. 2, which is taken looking down through the ROIC 3 as though the ROIC 3 were transparent. The ROIC 3 includes a plurality of separate amplifiers 30, such as transimpedance amplifiers, individual ones of which have an input coupled to one of the pixels and an output connected in common with other amplifiers 30 to a summing junction 31. A further amplifier 32 has an input coupled to the summing junction 31 and an output which represents the composite currents detected in parallel by all of the pixels of the large area, solid state radiation detector 1. Alternatively, each row or column of pixels, or groups of rows and columns, could have an associated summing junction 31 and amplifier 32, the outputs of which are then fed to a further summing junction and amplifier (not shown). The output of the amplifier 32 is suitably processed to detect the occurrence of the absorption of radiation within the semiconductor layer 24.

By example, a single 140 keV gamma ray can result in the generation of approximately $30 \times 10^3$ electron/hole pairs in the semiconductor layer 24, thereby further resulting in a detectable electrical pulse at the output of the amplifier 32. Not only is presence of the pulse indicative of the absorption of the gamma ray, but the pulse characteristics (e.g., rise time and amplitude) are indicative of the energy of the gamma ray. However, if the semiconductor layer 24 is subject to trapping or some other defects, the pulse characteristics can be adversely affected. By example, the rise time of the electrical pulse can be used to discriminate between gamma rays of different energies, and can thus be used to perform spectroscopy, as the identity of the radioactive source can be elucidated from the energy of the gamma rays that it emits.

The teaching of this invention thus provides a mechanism to effectively remove non-optimum regions of the semiconductor layer 24, thereby enabling an accurate measure of the energy of the incident radiation.

It should be noted that, due to the summing of the outputs of the individual pixels, the spatial location of the incident gamma ray, within the detecting layer 24, is not readily determined. However, and as was indicated previously, the primary purpose of the large area, solid state radiation detector 1 is not to image the incident radiation, but instead is intended to detect the presence of the radiation. This is accomplished by summing the charge carriers collected by the plurality of the pixels.

In accordance with an aspect of this invention, a localized region of the semiconductor layer 24 can be removed by opening the metal trace 16a that is coupled to the mesa 22a that overlies the localized defect region. Opening of the metal trace can be accomplished mechanically, such as by scribing, or through laser ablation of the trace 16a.

Figure 3:
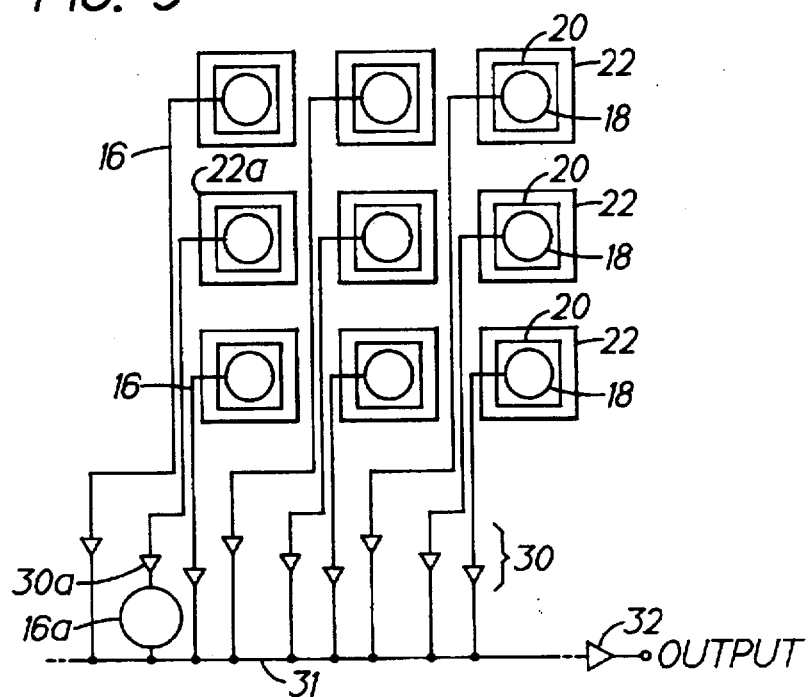

In FIG. 2 the trace 16a is shown being opened at the input of the associated amplifier 30a. Depending on the characteristics of the amplifiers 30, it may be desirable to instead open the trace at the amplifier's output, as shown in FIG. 3. In either case, the current originating in the defective pixel is physically isolated from the summing junction 31a and thus does not contribute to the output pulse from the amplifier 32, which is the desired result.

Figure 4:
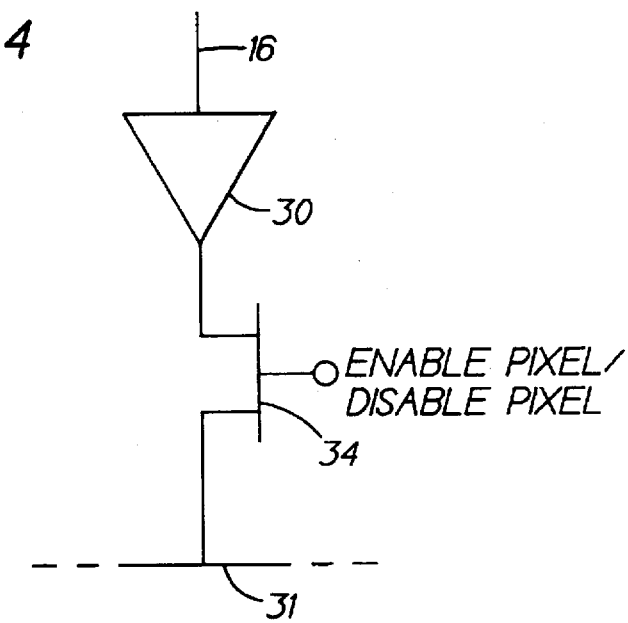
FIG. 4 illustrates a solid state switch for electrically removing an output of a pixel associated with an area of marginal performance of the large area, solid state radiation detector.

FIG. 4 illustrates a further embodiment of this invention, wherein a solid state switch, such as a transistor 34, is connected between the output of each of the amplifiers 30 and the summing junction 31. A control terminal of the transistor 34 is coupled to a signal which either turns the transistor on or off, thereby respectively enabling or disabling the output of the pixel connected through the metal trace 16 and the amplifier 30.

The evaluation of the "quality" of the detector properties may be accomplished during qualification testing either before or after hybridization. At this time the metal traces 16 determined to be connected to marginal or bad pixels are permanently cut with laser or other means to eliminate the defective pixels. Alternatively, the ROIC 3 is fabricated so as to detect excessive leakage current or other defects, and thus automatically isolate defective pixels from the summing junction 31. In this case the ROIC 3 locally generates the control signal for the transistors 34 depicted in FIG. 4. This approach has the additional advantage of providing a mechanism for automatically reevaluating the performance of the large area detector 1 dynamically during its operational life, and thereby compensating for changes in the properties due to aging, thermal changes, and the accumulated effects of ionizing radiation on the semiconductor layer 24.

Figure 5:
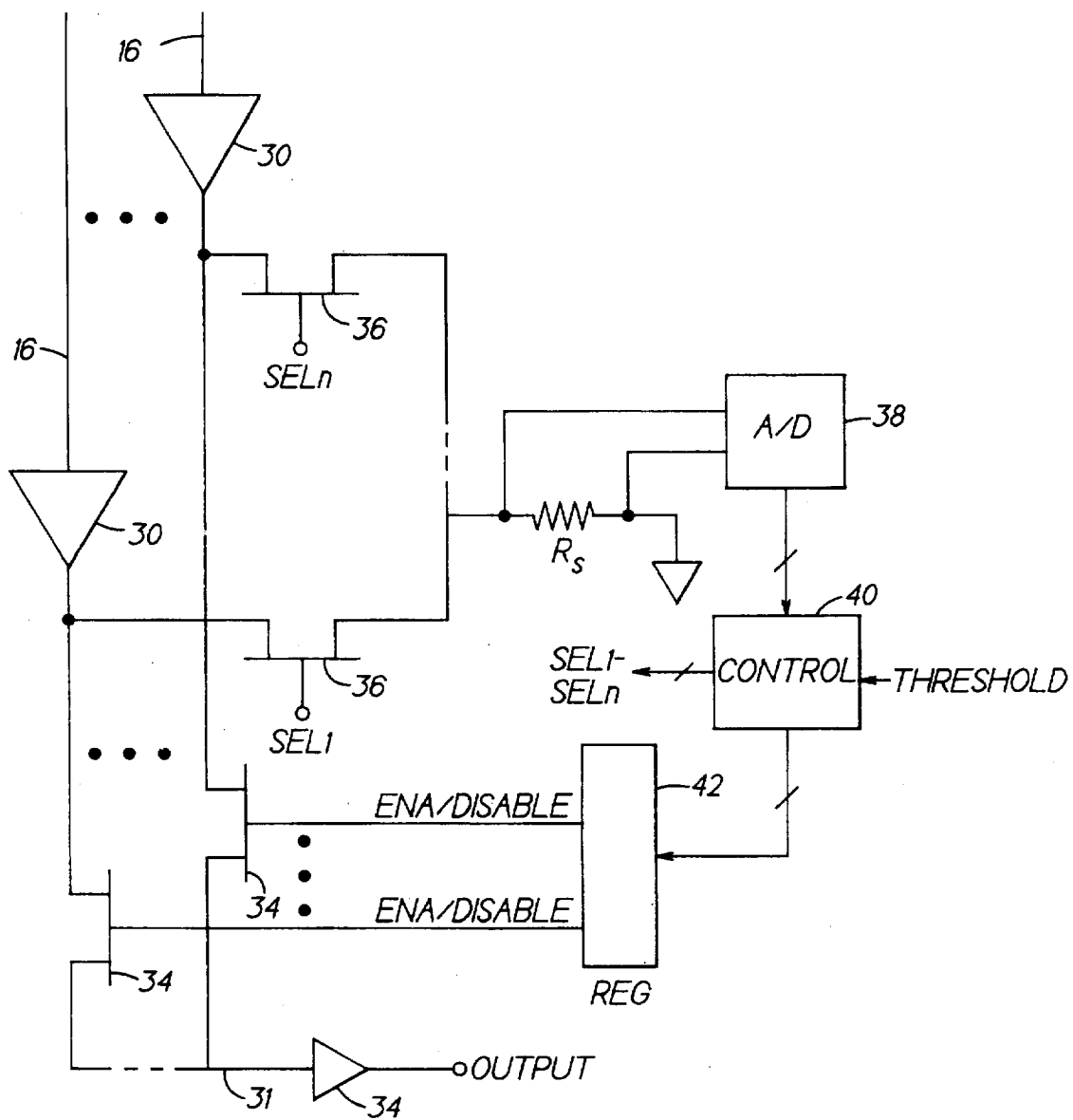
FIG. 5 is a schematic diagram that illustrates circuitry suitable for detecting a pixel associated with an area of marginal performance of the detector, and for generating a signal for removing the pixel from a summation signal.

Referring to FIG. 5, there is illustrated a simplified schematic diagram of one embodiment of circuitry suitable for selectively enabling and disabling individual ones of the pixels of the large area, solid state radiation detector 1. The operation of the circuitry of FIG. 5 is assumed for this example to occur during characterization or self-test mode of the large area, solid state detector 1, and to further occur without an appreciable radiation flux. As such, the leakage current (equivalent to a dark current in conventional imaging arrays) of the individual pixels is determined. In this embodiment individual ones of the outputs of the amplifiers 30 are coupled to normally off switches 36. Switches 36 are driven by control signals SEL1-SELn for n pixels of a given row or column of pixels (e.g., in a 64×64 array of pixels). When selected, i.e., turned on, a given one of the transistors 36 couples the output current of the associated amplifier 30 through a suitable current sensor, such as a sensing resistance $R_s$ and an A/D converter 38. Coupled to an output of the A/D 38 is a suitable controller, such as a processor 40. The processor 40 compares the sensed signal to a predetermined threshold value. If the sensed signal (i.e., the leakage current), in the absence of ionizing radiation, exceeds the threshold value, the processor 40 stores a bit into a register 42. The register 42, which may be a non-volatile device, has a plurality of outputs coupled to individual ones of the transistors 34 of FIG. 4. For a given one of the transistors 34, if the corresponding bit is set in the register 42, the transistor is turned off, thereby electrically decoupling the output of the associated amplifier 30 from summing junction 31. A multiplexer (not shown), which is also controlled by the processor 40, can be provided for coupling the SEL1-SELn signals to various ones of the rows or columns of the large area, solid state radiation detector 1, thereby enabling each pixel to be individually tested and selectively enabled or disabled. If the amplifiers 30 provide a voltage output, then the sense resistor $R_s$ can be eliminated, and the A/D 38 coupled directly to the output of individual ones of the amplifiers 30.

Due to the relatively simple task required of the processor 40, its functionality can be implemented with a state machine that drives a counter for generating the select signals, with an analog comparator for comparing the sensed output signal to the threshold, and a circuit for subsequently storing a bit into the register 42 that reflects the outcome of the comparison. In this case the A/D 38 can be eliminated. It is expected that those having skill in the art, when guided by the foregoing description, may envision a number of possible alternative embodiments for the ROIC circuitry shown in FIG. 5. It should further be noted that a number of the illustrated functional blocks could be located external to the ROIC.

It should be noted that although the transistor switch 34 on each trace has been described as being controlled by leakage current, other criterion can be employed, such as pulse duration and/or pulse risetime in response to a reference radiation source, either alone or in combination with the measurement of leakage current.

Alternatively, circuitry can be provided external to the ROIC 3 for detecting changes in the outputs of individual pixels, and for thus generating the appropriate signals for disabling individual ones of the pixels.

It should be noted that if the insulating layers over the pixellated surface are adequate, and if the surface is sufficiently planar, then the contact and traces may be lithographed monolithically on top of the pixellated detector chip itself without hybridization. Again, termination by laser cutting of the individual lines at the edge of the chip can be employed to isolate shorted or marginal pixels.

Presently, detectors are successfully fabricated from a size of about 20 micrometers square up to about 5×5 mm in area. Using the latter pixel dimension, a chip that is one inch square will thus contain only 25 pixels within that area, and a two inch chip only 100 elements. In the case of the one inch chip, each trace 16 could be up to, by example, 0.5 mm wide. These dimensions are readily achieved with currently available photolithographic techniques. It should be realized that the pixels may be made as small or as large as is desired, in accordance with fabrication constraints. The pixel size can be selected as a function of the uniformity and homogeneity of the semiconductor material that forms the detection layer 24.

Since the traces are connected by low resistivity, the capacitance between traces is essentially zero. Also, in that the total surface area of the traces 16 and 31 is not larger than the area of a conventional blanket detector contact which would normally cover the entire detector side, the capacitance between the contact 26 on the opposite side of the semiconductor layer 24 and the traces 16 is the same or less than that which exists between contacts covering both sides of the layer 24. Also, if the ROIC 3 contains separate sensing circuits for each pixel, and if the amplified charge is summed at the chip edge or externally, the effective capacitance of the detector circuit may be reduced.

It can thus be seen that an important aspect of this invention is an ability to isolate poor or bad areas of a large area detector, and to eliminate these areas from contributing adversely to the overall detector performance.

Although described above in the context of a radiation detector constructed of Group II-VI material, it should be realized that the teaching of this invention is not limited to only this material. By example, Group III-V and Group IV semiconductor materials can also be employed. Furthermore, the teachings of this invention are not intended to be limited to any specific numbers or sizes of pixels, array sizes or geometries, or to structures that are required to be hybridized with readout integrated circuits. By example, and as was mentioned above, it is within the scope of this invention to fabricate all or some of the readout structures (e.g., traces, amplifiers, etc.) directly over an insulating layer that covers the tops of the mesa structure 22, thereby providing a monolithic large area, solid state detector and signal readout signal.

Thus, while the invention has been particulary shown and described with respect to preferred embodiments thereof, it will be understood by those skilled in the art that changes in form and details may be made therein without departing from the scope and spirit of the invention.

What is claimed is:

1. A large area radiation detector, comprising:
   a volume of semiconductor material that is responsive to ionizing radiation for generating charge carriers, said volume of semiconductor material having a substantially constant thickness across said detector;
   a first electrode coupled to one surface of said volume of semiconductor material;
   a plurality of second electrodes coupled to a second surface of said volume of semiconductor material, individual ones of said second electrodes being associated with an underlying region of said volume of semiconductor material for collecting charge carriers from said underlying region;
   circuit means coupled to said plurality of second electrodes for summing charge carriers collected by said plurality of second electrodes to produce an output signal; and
   means for selectively decoupling individual ones of said second electrodes from said circuit means at a point between said second surface and an output of said circuit means.

2. A large area radiation detector as set forth in claim 1, wherein said circuit means is comprised of electrically conductive traces that couple individual ones of said plurality of second electrodes to an amplifier, and wherein said means for selectively decoupling is comprised of an open circuit in at least one of said traces for preventing charge carriers from an associated one of said second electrodes from contributing to said output signal.

3. A large area radiation detector as set forth in claim 1, wherein said circuit means is comprised of electrically conductive traces that couple individual ones of said plurality of second electrodes to an amplifier, and wherein said means for selectively decoupling is comprised of a semiconductor switch that is connected in series with each of said traces and that, when opened, prevents charge carriers from an associated one of said second electrodes from contributing to said output signal.

4. A large area radiation detector as set forth in claim 3, and further comprising control circuitry for selectively opening individual ones of said semiconductor switches.

5. A large area radiation detector as set forth in claim 4, wherein said control circuitry is responsive to a signal readout from individual ones of said second electrodes for selectively opening individual ones of said semiconductor switches if the signal indicates that the associated region of the volume of semiconductor material is defective or marginal.

6. A large area radiation detector as set forth in claim 4, wherein said volume of semiconductor material, said first electrode, and said plurality of second electrodes comprise a first structure, wherein said circuit means, said means for selectively decoupling, and said control circuit comprise a second structure, and wherein said first and second structures are electrically and physically coupled together.

7. A large area radiation detector as set forth in claim 1, wherein said volume of semiconductor material, said first electrode, and said plurality of second electrodes comprise a first structure, wherein said circuit means comprises a second structure, and wherein said first and second structures are electrically and physically coupled together.

8. A large area radiation detector as set forth in claim 7, wherein said first and second structures are hybridized.

9. A large area radiation detector as set forth in claim 8, wherein said first and second structures are coupled together by electrically conductive bumps.

10. A method for operating a large area, solid state radiation detector, comprising the steps of:
    providing the detector with a volume of semiconductor material that is responsive to ionizing radiation for generating charge carriers, with a first electrode coupled to one surface of the volume of semiconductor material, and with a plurality of second electrodes coupled to a second surface of the volume of semiconductor material, individual ones of the second electrodes being associated with an underlying region of the volume of semiconductor material for collecting charge carriers from the underlying region, the volume of semiconductor material having a substantially constant thickness across the detector;
    irradiating the detector with ionizing radiation to generate charge carriers within the volume of semiconductor material; and
    at a summing node, combining charge carriers collected from individual ones of the second electrodes to generate an output signal.

11. A method as set forth in claim 10, and further comprising a step of decoupling at least one of the plurality of second electrodes from the summing node based on at least one charge carrier collection criterion, the step of decoupling being accomplished at a point between the second surface and the summing node.

12. A method for operating a large area, solid state radiation detector, comprising the steps of:
    providing the detector with a volume of semiconductor material that is responsive to ionizing radiation for generating charge carriers, with a first electrode coupled to one surface of the volume of semiconductor material, and with a plurality of second electrodes coupled to a second surface of the volume of semiconductor material and to a summing node, individual ones of the second electrodes being associated with an underlying region of the volume of semiconductor material for collecting charge carriers from the underlying region said volume of semiconductor material having a substantial constant thickness across said detector;

operating the detector without a source of ionizing radiation to generate charge carriers resulting from leakage currents within the volume of semiconductor material;

detecting a leakage current collected from individual ones of the second electrodes; and decoupling from the summing node any of the plurality of second electrodes having a detected leakage current that exceeds a threshold value of leakage current, the step of decoupling being accomplished at a point between the second surface and the summing node.

13. A method as set forth in claim 12, wherein the step of decoupling includes a step of opening an electrically conductive trace that couples the second electrode to the summing node.

14. A method as set forth in claim 12, wherein the step of decoupling includes a step of opening a semiconductor switch that couples the second electrode to the summing node.

15. A method for fabricating a large area, solid state radiation detector, comprising the steps of:

providing a volume of semiconductor material that is responsive to ionizing radiation for generating charge carriers, said volume of semiconductor material having a substantially constant thickness across said detector;

fabricating a first electrode that is coupled to one surface of the volume of semiconductor material;

fabricating a plurality of second electrodes that are coupled to a second surface of the volume of semiconductor material and to a summing node, individual ones of the second electrodes being associated with an underlying region of the volume of semiconductor material for collecting charge carriers from the underlying region;

detecting a presence of one or more second electrodes that are associated with a region of the volume of semiconductor material that exhibits charge carrier generation ability that falls below a threshold ability; and decoupling from the summing node any of the detected second electrodes, the step of decoupling being accomplished at a point between the second surface and the summing node.

16. A method as set forth in claim 15, wherein the step of decoupling opens an electrically conductive trace that connects a detected one of the second electrodes to the summing node.

17. A method as set forth in claim 15, wherein the step of decoupling opens a switch that is coupled in series between a detected one of the second electrodes and the summing node.

18. A method as set forth in claim 15, wherein the step of detecting includes a step of detecting a magnitude of a leakage current output from individual ones of the second electrodes.

19. A method as set forth in claim 15, wherein the step of detecting includes a step of detecting a temporal characteristic of a signal output from individual ones of the second electrodes.

20. A large area radiation detector, comprising:

a first portion comprising a volume of semiconductor material that is responsive to ionizing radiation for generating charge carriers, said volume of semiconductor material having a substantially constant thickness across said detector and having a first electrode coupled to one surface of said volume of semiconductor material, said first portion further comprising a plurality of second electrodes coupled to a second surface of said volume of semiconductor material, individual ones of said second electrodes being associated with an underlying region of said volume of semiconductor material for collecting charge carriers from said underlying region; and a second portion comprising a plurality of electrically conductive traces that couple individual ones of said plurality of second electrodes to an individual one of a plurality of amplifiers, each of said plurality of amplifiers having an output coupled to a summing node wherein an output signal from each of said plurality of amplifiers is summed together to generate a detector output signal, said second portion further comprising a plurality of switches individual ones of which are connected in series with one of said traces for selectively one of coupling or decoupling an associated one of said second electrodes to said summing node, said second portion further comprising storage means for storing a plurality of switch control signals, individual ones of said switch control signals being coupled to an individual one of said switches for controlling a switching state of said switch to be either open or closed, wherein a state of each of said switch control signals is predetermined in accordance with at least one of a charge carrier generation characteristic of the region of said volume of semiconductor material underlying the associated one of the second electrodes, a leakage current output from the associated one of said second electrodes, or a temporal characteristic of a signal output from the associated one of said second electrodes.

* * * * *